United States Patent [19]

Rüger

[11] 4,210,807
[45] Jul. 1, 1980

[54] HEAT IMAGING APPARATUS

[75] Inventor: Roderich Rüger, Munich, Fed. Rep. of Germany

[73] Assignee: Messerschmitt-Boelkow-Blohm Gesellschaft mit beschraenkter Haftung, Munich, Fed. Rep. of Germany

[21] Appl. No.: 921,945

[22] Filed: Jul. 5, 1978

[30] Foreign Application Priority Data

Jul. 14, 1977 [DE] Fed. Rep. of Germany ....... 2731739

[51] Int. Cl.² .............................................. H01J 31/49
[52] U.S. Cl. .................................... 250/330; 250/334; 250/338; 250/342
[58] Field of Search ............... 250/338, 339, 342, 340, 250/349, 353, 330, 332, 334; 73/355 R; 358/113

[56] References Cited

U.S. PATENT DOCUMENTS

| 3,104,478 | 9/1963 | Strauss et al. ................... 250/342 X |
| 3,107,070 | 10/1963 | Willits et al. ..................... 250/342 X |
| 4,107,530 | 8/1978 | Brumfield et al. .................. 250/342 |
| 4,117,327 | 9/1978 | Lamelot et al. .................. 250/342 X |

Primary Examiner—Davis L. Willis
Attorney, Agent, or Firm—W. G. Fasse; D. F. Gould

[57] ABSTRACT

A heat imaging apparatus is used to detect and display heat radiation from a target. For this purpose the apparatus has optical components with a diffusion circle of a given dimension and heat detector elements each of which has a size smaller than said given dimension of said diffusion circle, whereby the geometric resolution and hence also the target recognition range are substantially improved.

3 Claims, 5 Drawing Figures

HEAT IMAGING APPARATUS

BACKGROUND OF THE INVENTION

The present invention relates to a heat imaging apparatus including optical means as well as a heat radiation detector device located in the focal plane of the optical means. The heat radiation detector device may comprise one or several detector elements.

Heat imaging devices are, for example, used in the guidance control system of anti-tank weapons for the purpose of recognizing and combating heat radiating targets even when visibility is poor or at night under which conditions such targets may be hardly visible or not at all. The geometric as well as the thermal resolution of the heat imaging apparatus should be as large as possible for this purpose in order to recognize targets the temperature of which differs only slightly from the temperature of the environment. Further, the heat imaging apparatus should be also capable of recognizing or resolving temperature differences within the target itself in order to identify the target.

Generally, the resolution precision of such heat imaging devices is tested with the aid of test targets. These test targets comprise an arrangement of bars or beams, whereby adjacent beams display a temperature difference of about 2K°. These tests targets are located at a given distance from the heat imaging apparatus or device. The resolution precision of the heat imaging device is then determined with regard to the objective whether the imaging device has recognized the target and if so, what information content has been identified.

The invention is based on the recognition that the optical means and the detector of such heat imaging devices have respectively different geometric resolution capabilities so that the two cooperating components also have different modulation transfer functions or characteristics. This fact has been recognized heretofore, for example, by Lloyd "Thermal Imaging Systems", Plenum Press New York 1975, pg. 99 and following pages. Said book provides the equations dealt with in the present disclosure so that for a more detailed discussion of said equations reference is made to said book. However, the conclusions reached according to the invention are not disclosed in said book by Lloyd.

The following discussion with reference to an actual example shall suffice to discuss the prior art.

Prior art heat imaging devices are required to resolve a test target having seven beams and a width of 2.3 meters as well as a temperature difference of 2K° between adjacent beams, said resolution shall have a range as large as possible.

The resolution of optical devices is determined by, among other factors, the geometry of the imaging system. However, in heat imaging devices the resolution is strongly influenced by the relatively large wave lengths causing diffraction effects. Thus, a point located at an infinite distance does not appear as such on the optical axis of the heat imaging devices, rather, it is imaged as a diffraction figure in the form of the so-called diffusion circle. The diameter "d" of the diffusion circle depends on the wave lengths λ and on the diameter "D" of the optical system of the heat imaging device. Thus, d is expressed as follows:

$$d = (\lambda \cdot 2.44)/D \qquad \text{Eq. (1)}$$

wherein "D" is expressed in miliradians.

The optical system frequently used in heat imaging devices has a diameter of 160 mm and a focal length of about 330 mm. For such an optical system the diffusion circle diameter is 0.15 miliradian for a wave length of 10μ. Expressed in length units the diameter of the diffusion circule is 50μ. Substantially all of the heat energy emanating from a point shaped heat source located at an infinite distance is concentrated in the diffusion circle as far as such heat energy is detected by the optical system. In this context the expression "substantially all" means about 85% of said heat energy emanating from a point source at an infinite distance.

In view of the above considerations all heat imaging devices of the prior art are so constructed that the individual heat detector elements correspond in their size at least to the diffusion circle in order to gather the maximum proportion of energy radiated from a target in order to detect such a target.

However, due to the above mentioned diffraction effects, the resolution capability of heat imaging devices is limited. For example, in accordance with the above mentioned dimensioning method it is possible to reduce the geometric resolution to 0.15 miliradians at the most for the selected device design.

OBJECTS OF THE INVENTION

In view of the above it is the aim of the invention to achieve the following objects singly or in combination:

to improve a heat imaging device in such a manner that the geometric resolution is substantially increased while maintaining the costs and structural size of the device, especially of the optical means, unchanged;

to construct the detector elements, more specifically each detector element, to be smaller in size than the above mentioned diffusion circle;

to increase the range of heat imaging devices without increasing their structural size and costs; and to depart from the prior art teachings which aimed at maximizing the detection and devaluation of heat energy emanating from a target.

SUMMARY OF THE INVENTION

According to the invention there is provided that the size of the individual heat detectors is smaller than the size or dimension of the diffusion circle of the optical means. The size of the individual detectors is selected so that the product of the detector size times the modulation transfer function of the heat imaging system is a maximum for the desired resolution of the heat imaging device, whereby the resolution is determined by the spatial frequency. In this connection the spatial frequency is defined as the number of radiation maxima and radiation minima following each other in sequence and at equal spacings and representing the radiation emanating from a test target per miliradian, said heat imaging device being trained on said target. The modulation transfer function of the heat imaging system or of the heat detectors is defined as the proportion of the information content of the heat radiation respectively received and resolved by all heat detector elements of the heat imaging system such as the optical means, the detector means, or the like.

According to the invention the surprising result is achieved that the size of the detector may be smaller than the size of the diffusion circle, indeed, and that in spite thereof the resolution of the heat imaging system is larger than in connection with prior art heat imaging devices.

Thus, the invention teaches to intentionally forego, contrary to the opinion of the experts in this art, intercepting and evaluating by means of the detector, the entire content of the heat radiation entering into the heat imaging device within the diffusion circle. By foregoing the interception and the evaluation of some of the received heat radiation, one achieves the surprising advantage that the resolution of the heat imaging device and thus the target recognition range is improved.

BRIEF FIGURE DESCRIPTION

In order that the invention may be clearly understood, it will now be described, by way of example, with reference to the accompanying drawings, wherein.

DETAILED DESCRIPTION OF PREFERRED EXAMPLE EMBODIMENTS

Figure 1:
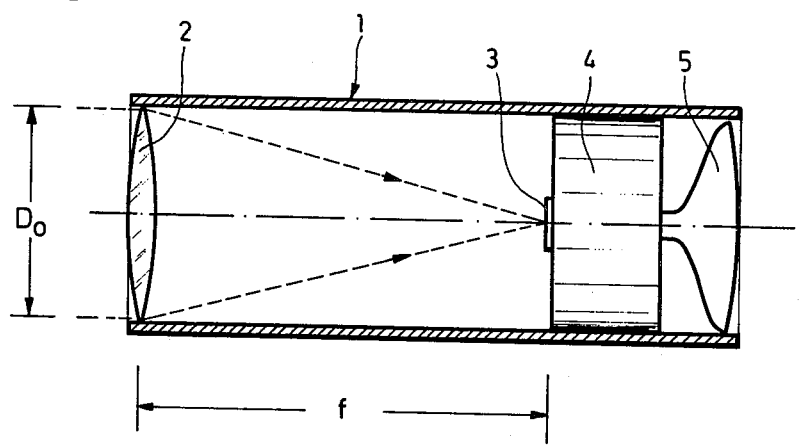
FIG. 1 is a sectional view through a schematic illustration of a heat imaging device according to the invention along the longitudinal axis thereof.
Figure 2:
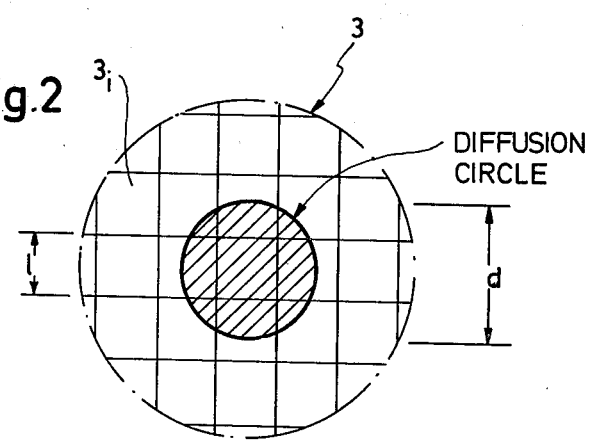
FIG. 2 is a partial plan view of the heat detector means of the heat imaging device, whereby the heat detecting means comprise a plurality of heat detecting elements.

Referring to FIG. 1 the heat imaging device 1 comprises optical means 2 with a lens having a diameter $D_o$ of, for example, 160 mm and a focal length f of 330 mm. A heat detecting device 3 is arranged in the focal plane of the optical means. The heat detecting device 3 comprises a plurality of detector elements $3_i$ arranged next to each other as best seen in FIG. 2. The total number of detector elements is "N". The detector elements have each a length "L" along the edge and a surface area $A_D$ which may also be expressed as an angular measure $a_D$. The detector elements are well known semiconductor components such as photocells which are connected in a known manner to an amplifier 4 the output of which controls a display device 5 such as a picture tube having a ground display screen. Thus, an image of the target on which the apparatus is trained, appears on the display screen in the form of a heat image as resolved by the optical and detector means. All the components as described above of a heat imaging device have respectively only a certain resolution capability. However, for the further discussion in this disclosure the constant electronic resolution capability of the amplifier 4 and of the picture tube 5 are not taken into account since they are constant.

Figure 3:
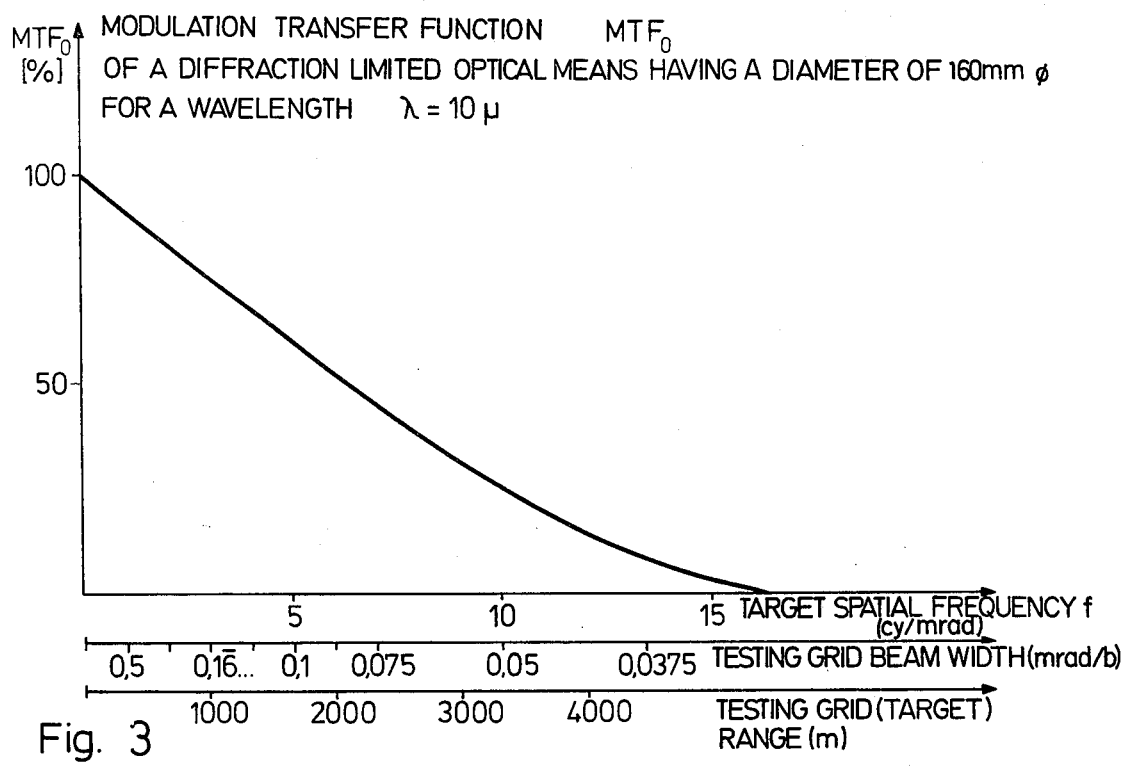
FIG. 3 illustrates a diagram of the modulation transfer function that is of the resolution of the optical means used in the heat imaging device.

FIG. 3 shows the modulation transfer function $MTF_O$ in response to the local frequency of the target for a diffraction limited optical means having the above mentioned characteristic data, namely, a diameter of 160 mm and a focal length of 330 mm, whereby the illustration is in percent values for a wave length of 10μ. The illustration represents the number of the radiation maxima and radiation minima or the number of beams of a test target per miliradians (cy/mrad). For clarification there are indicated below the abscissa also the width of the beams making up the test grid or grating in miliradians (mrad/L). The distance to the target, namely the testing grid, is indicated below the abscissa in meters (m).

Figure 4:
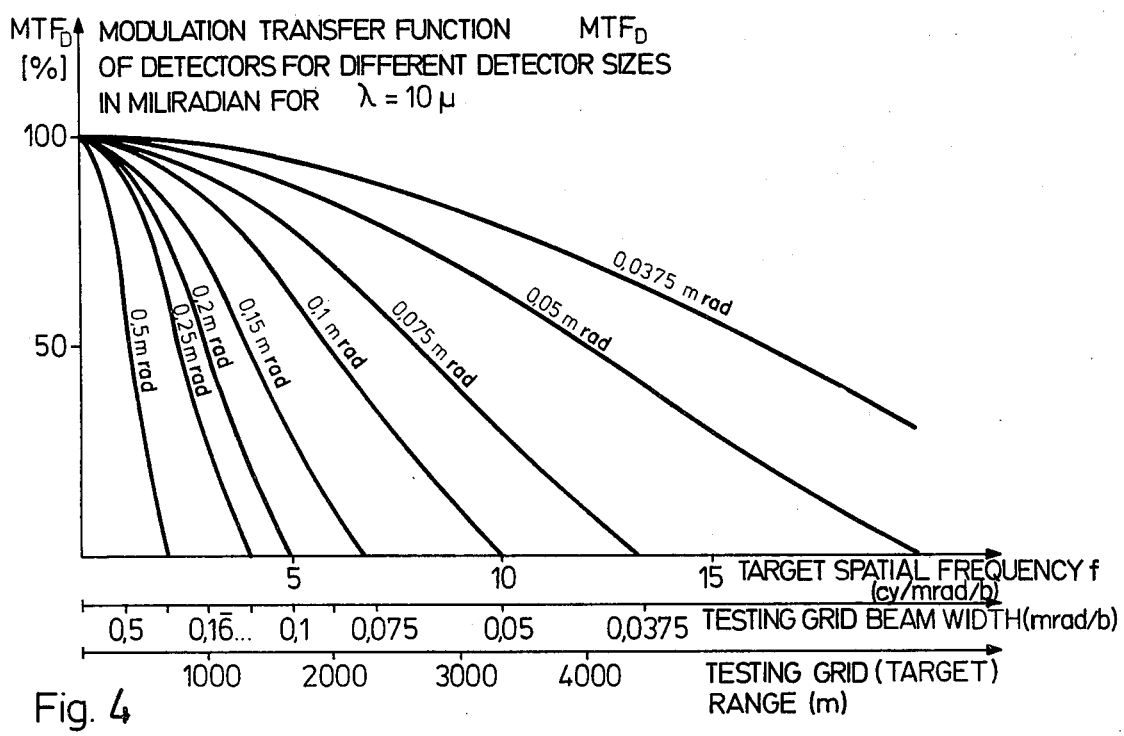
FIG. 4 is a diagram of the modulation transfer function of the individual detectors or detector elements of the heat detecting means as a function of the size of the detector elements.

FIG. 4 illustrates the spatial modulation transfer function $MTF_D$ of the detectors for different detector sizes given in miliradians also as a function of or in response to the local frequency of the targets. Below the abscissa in FIG. 4 there are further shown the beam width of the test grating in miliradians (m rad/L); as well as the distance or range to the test grating of the target which is indicated in meters just as in FIG. 3.

The diagrams of FIGS. 1 and 2 relate to detectors which are used in such heat imaging devices with optical means as mentioned above, whereby the detectors have a size of $\geq 0.15$ mrad corresponding to an edge length $\geq 50\mu$. In conjunction with such detectors FIGS. 1 and 2 illustrate that the zero point of the modulation transmission function is located at a local frequency of about 6.6 cy/mrad corresponding to 0.075 mrad test grating beam width.

For this local frequency of the target the optical means however still have a modulation depth of about 48%. The zero point of the modulation transmission frequency for a detector having an edge length corresponding to one half the above mentioned edge length, and corresponding to a detector diameter of 0.075 mrad, is located at twice the local frequency, namely, at about 13.3 cy/mrad corresponding to a 0.035 mrad test grating beam width. For this local frequency the modulation transfer function of the optical means is about 9% which means that the modulation transfer function of detectors for a given local frequency increases as the detector size decreases. This discovery is illustrated in FIG. 4 by the group of curves in which the parameter of the detector size diminishes from left to right. This increase in the modulation, transfer function of the detector must, however, be weighed against the loss of transmission content resulting from the signal to noise ratio caused by the size reduction of the detector. In other words, the signal to noise ratio is less advantageous for smaller size detectors.

For such a comparing or weighing it is necessary to define a few equations. Thus, the modulation transfer function of the detector is determined by the following equation:

$$MTF_D = \frac{\sin(\pi \cdot a_D \cdot f_T)}{\pi \cdot a_D \cdot f_T} \qquad \text{Equation (2)}$$

The foregoing equation appears also in the above mentioned book by Lloyd at page 89, equation 3.31. In the foregoing equation (2) the detector size $a_D$ is expressed in an angular measure, that is in terms of miliradians and the local frequency $f_T$ of the target. The above mentioned signal to noize ratio is inversely proportional to the temperature resolution NET equivalent to the noise. The temperature resolution NET is determined by the following equation:

$$NET = \frac{\sqrt{A_D} \cdot 4 \cdot \sqrt{\Delta B}}{D_0^2 \cdot a_D^2 \cdot M^*} \qquad \text{Equation (3).}$$

The foregoing equation appears in the book by Lloyd on page 176. In the equation (3) $A_D$ represents the detector surface. $\Delta B$ represents the band width equivalent to the noise. $D_O$ represents the diameter of the optical length. $M^*$ represents the detector identifying number which determines the sensitivity of the detector and thus of the heat imaging device.

Equation (3) describes merely the noise equivalent temperature resolution of the device, whereby it has not been taken into account that the heat imaging device transmits the resolved signals onto an image or picture screen which is observed by an operator. The operator has, as is known, the capability to further evaluate the signals appearing on the image screen due to the spatial and time integration characteristics of the eye. This capability of the operator may be taken into account when combining the noise equivalent temperature resolution NET and the modulation transfer function of the detector as a function of the detector size, whereby said combination is expressed by the minimal temperature difference MRT which may still be resolved, please see in this context equation 5.58 on page 190 of the above mentioned book by Lloyd.

$$MRT = \frac{3 \cdot NET \cdot a_D \cdot f_T}{(\Delta B \cdot T_{eye} \cdot \dot{F} \cdot \tau_d)^{\frac{1}{2}} MTF_S} \qquad \text{Equation (4)}$$

In this equation $\dot{F}$ is the image frequency of the heat imaging device. $f_T$ is again the spatial frequency of the target. $\Delta B$ is the noise equivalent band width. $\tau_d$ is the dwell time of the detector element in the instantaneous field of view of the operator. $MTF_S$ is the modulation transfer function of the heat imaging system comprising the optical means and the detector as well as further components such as electronic components and so forth, and wherein $T_{eye}$ is the integration time of the eye of the operator (which is on the average about 0.2 seconds).

If one now inserts in the equation (4) the expression for the noise equivalent temperature resolution NET from equation (3) and if further the noise equivalent band width $\Delta B$ is replaced by the expression:

$$\Delta B = \sqrt{\frac{\pi}{2} \cdot \frac{N \cdot \dot{F}}{2 \cdot n}} \qquad \text{Equation (5)}$$

The results is equation (6) shown below. Incidentally, in Equation (5) the total number of detector elements of the complete detector arrangement is "n". The number "N" represents the image points while $\dot{F}$ represents the image frequency of the heat imaging device.

$$MRT = \frac{const. f \cdot f_T}{D^2{}_0 \cdot \sqrt{n} \cdot M^* \cdot MTF_S \cdot \sqrt{A_D}} \qquad \text{Equation (6)}$$

Equation (6) is an expression for the minimal resolvable temperature difference MRT. Equation (6) takes into account that the expression $\Delta B \cdot \tau_D$ is a constant and the angular dimension of the detector is $a_D = \sqrt{A_D}/f$, wherein f is the focal length of the optical means.

Equation (6) illustrates that the minimal resolvable temperature difference becomes smallest when $\sqrt{A_D} \cdot MTF$ is a maximum. Thus, the optimal detector size results for a given local frequency of the target when the expression $$\frac{1}{\sqrt{A_D} \cdot MTF_S} \qquad \text{Equation (7)}$$

becomes a minimum.

In the foregoing equation the relevant assumption was made that the number "N" of image points is proportionally/$A_D$ that is, inversely proportional to the detector surface.

Referring to FIG. 4, an example will now be explained for a range of about 3000 m. A testing target comprising 7 beams having a width of 2.3 m is assumed. The modulation value is determined by the detector geometry and becomes zero for a detector having an edge length of 0.15 mrad corresponding to 50$\mu$. The curve for the detector edge length of 0.15 m rad touches the abscissa at about 2300 meters target range. Hence, the respective modulation value is zero also at the example 3000 m range. However, the modulation value becomes 10% for a detector edge length of 0.1 mrad corresponding to about 35$\mu$ at said 3000 m range. Similarly, for an edge length of 0.075 mrad corresponding to 25$\mu$ the modulation value becomes 40% at said 3000 m range. For 0.05 mrad corresponding to 17.5$\mu$ edge lengths the modulation value becomes 70% and for 0.0375 mrad, corresponding to an edge length of 12.5$\mu$ it becomes about 82%. If one calculates the products from the square root of the detector surface, that is, the edge length of the detector in miliradians is multiplied with the respective modulation transfer function value of the heat imaging systems, it may be noted that the product becomes a maximum for about 0.05 mrad.

Figure 5:
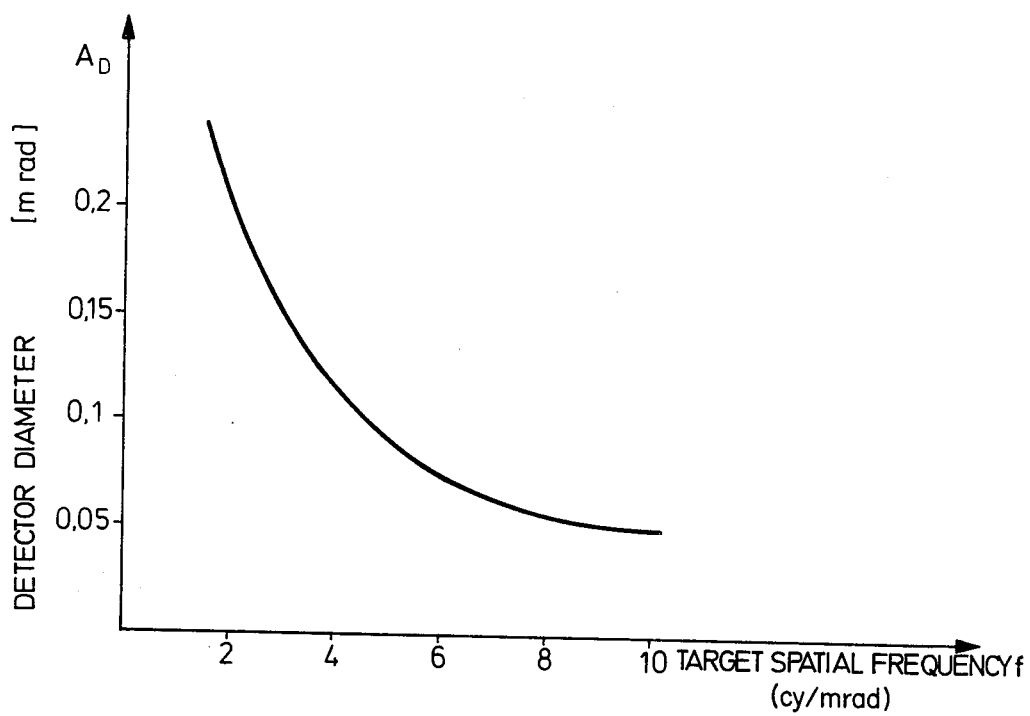
FIG. 5 is a diagram illustrating the optimal size of a detector element as a function of the spatial frequency of the target onto which the heat imaging device is trained.

FIG. 5 shows the curve of the detector diameter in miliradians for an optical means with the above given characteristic data, as a function of the local frequency of the target for which frequency the mentioned product becomes a maximum. The shape of the curve in FIG. 3 depends on the shape of the $MTF_S$-function. In FIG. 5 the $MTF_S$-function, namely the function of the system, is plotted as the product of the MTF-function of the detector and of the MTF-function of the optical means.

From FIG. 5 it is, for example, apparent, that the optical detector diameter is about 0.075 mrad for a local target frequency of 6 (cy/mrad) which corresponds to a testing grating distance of 2 km. Thus, this diameter is only about half as large as in prior art heat imaging devices with optical means having the above mentioned characteristic data. Nevertheless, according to the invention, the smaller detector diameter results in an improvement in the resolution capability of the heat imaging device or apparatus.

By adapting the detector size according to the invention it becomes thus possible in the light of the above disclosure to substantially increase the range of heat imaging devices without increasing the structural size and without increasing the costs. Compared to a conventional detector with 0.15 mrad diameter having a resolution range heretofore of about 1700 m and under the assumption that the heat imaging device is capable to still evaluate an information content of 10% of the original information, it will be noted that the resolution range is increased to about 3,000 m for a heat imaging device according to the invention having a detecting diameter of 0.075 mrad. This improved resolution range may be ascertained from FIGS. 1 and 2 by respectively multiplying the corresponding values of the modulation transfer function of the optical means and the modulation transfer function of the detector means.

Although the invention has been described with reference to specific example embodiments, it will be appreciated, that it is intended to cover all modifications and equivalents within the scope of the appended claims.

What is claimed is:

1. A heat imaging apparatus comprising a heat image system including optical means having a focal surface, heat detector means located in said focal surface, said optical means further having a diffusion circle of given dimension, said heat detector means comprising at least one heat detector element, each heat detector element having a size ($A_D$) smaller than said given dimension of said diffusion circle.

2. The apparatus of claim 1, wherein said size of each individual heat detector element is so selected that the product of the detector element size ($A_D$) times the modulation transfer function ($MTF_S$) of said heat image system becomes a maximum for the desired resolution of the heat imaging apparatus, said resolution being determined by the local frequency (f) which in turn is defined as the number of maxima and minima spaced at equal intervals per miliradian, said maxima and minima relating to the heat radiation emanating from a test target on which said heat imaging apparatus is trained, said modultion transfer function of said heat image system being defined as the proportion of the information content of the heat radiation respectively received and resolved by all heat detector elements.

3. The apparatus of claim 2, wherein said modulation transfer function ($MTF_S$) of said heat image system is approximated by the product of the modulation transfer function ($MTF_O$) of said optical means and of the modulation transfer function ($MTF_S$) of said heat detector means.

* * * * *